United States Patent
Gotkis et al.

(10) Patent No.: US 8,890,066 B1
(45) Date of Patent: Nov. 18, 2014

(54) SHARP SCATTERING ANGLE TRAP FOR ELECTRON BEAM APPARATUS

(75) Inventors: Yehiel Gotkis, Fremont, CA (US); Garrett Pickard, Mountian View, CA (US); Stanislaw Marek Borowicz, San Jose, CA (US); Tzu-Chin Chuang, Cupertino, CA (US); Mehran Nasser-Ghodsi, Hamilton, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 2366 days.

(21) Appl. No.: 11/265,811

(22) Filed: Nov. 3, 2005

Related U.S. Application Data

(60) Provisional application No. 60/711,856, filed on Aug. 26, 2005.

(51) Int. Cl.
*G21K 5/04* (2006.01)

(52) U.S. Cl.
USPC ........ 250/306; 250/307; 250/310; 250/492.1; 250/492.3

(58) Field of Classification Search
USPC ............. 250/306, 307, 310, 311, 396 R, 397, 250/398, 400, 492.1, 492.2, 492.3
See application file for complete search history.

(56) References Cited

U.S. PATENT DOCUMENTS

| | | | |
|---|---|---|---|
| 5,578,821 A | 11/1996 | Meisberger et al. | |
| 6,774,365 B2 | 8/2004 | Okoroanyanwu et al. | |
| 6,822,233 B2 | 11/2004 | Nakamura et al. | |
| 2002/0012853 A1* | 1/2002 | Suganuma et al. | 430/5 |
| 2002/0145118 A1* | 10/2002 | Pearce-Percy | 250/397 |
| 2005/0029451 A1* | 2/2005 | Nagahama et al. | 250/310 |
| 2005/0127294 A1* | 6/2005 | Katane et al. | 250/311 |
| 2006/0163480 A1* | 7/2006 | Koyama et al. | 250/310 |
| 2006/0249686 A1* | 11/2006 | Slowko | 250/397 |
| 2007/0187600 A1* | 8/2007 | Nagahama et al. | 250/310 |

* cited by examiner

*Primary Examiner* — Nicole Ippolito
(74) *Attorney, Agent, or Firm* — Okamoto & Benedicto LLP

(57) ABSTRACT

One embodiment relates to an electron beam apparatus. The apparatus includes a source for generating an incident electron beam, an electron lens for focusing the incident electron beam so that the beam impinges upon a substrate surface and interacts with surface material so as to cause secondary emission of scattered electrons, and a detector configured to detect the scattered electrons. The apparatus further includes an advantageous device configured to trap the scattered electrons which are emitted at sharp angles relative to the sample surface plane of the substrate surface. Other embodiments are also disclosed.

17 Claims, 11 Drawing Sheets

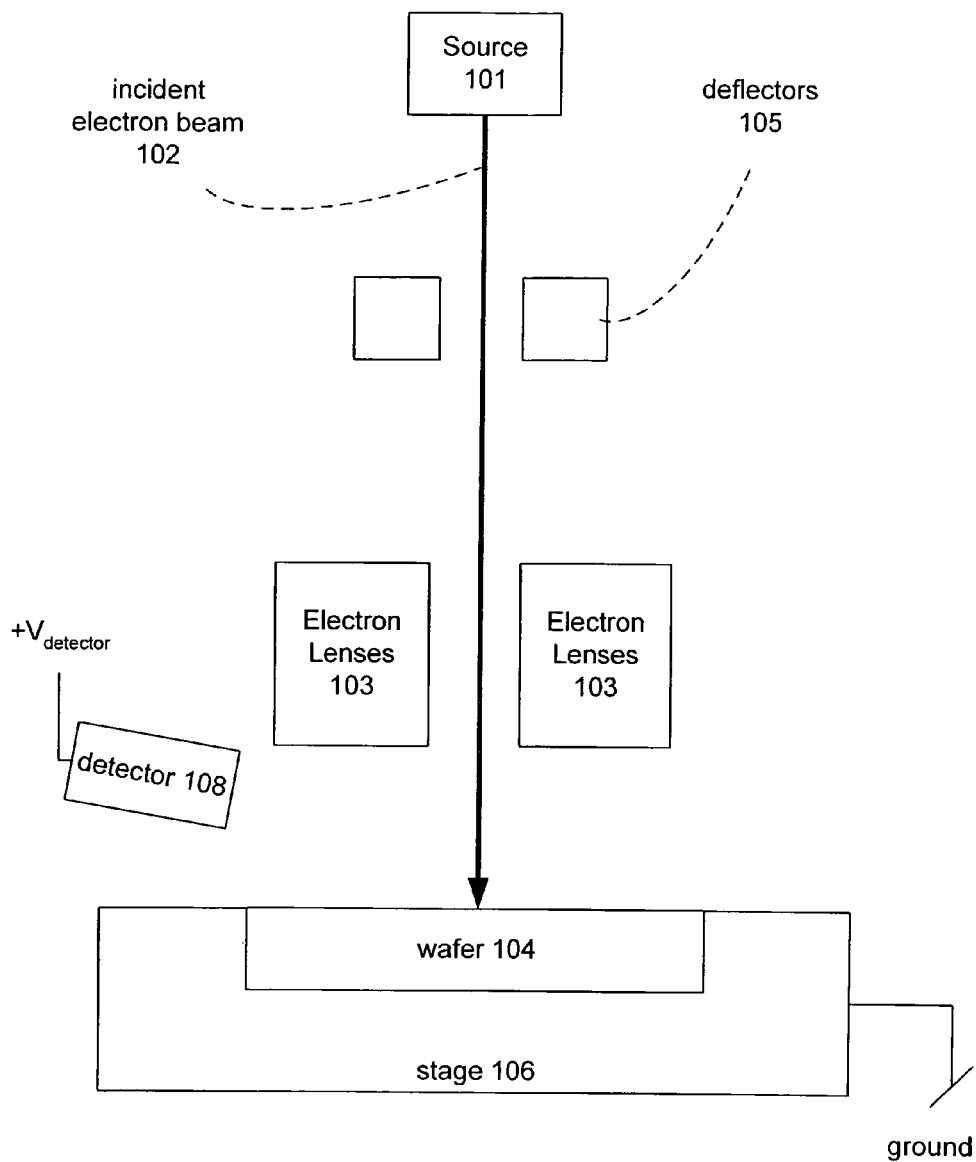
FIG. 1
(Conventional)

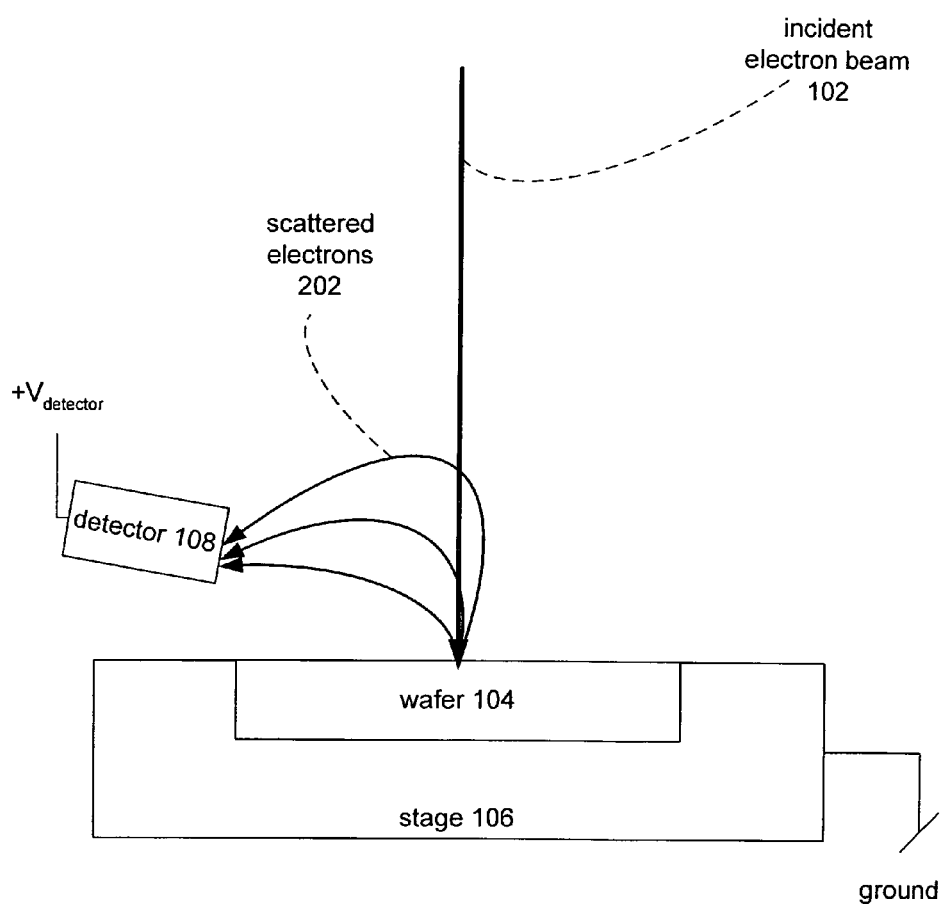
FIG. 2
(Conventional)

SHARP SCATTERING ANGLE TRAP FOR ELECTRON BEAM APPARATUS

CROSS-REFERENCE TO RELATED APPLICATIONS

The present application claims the benefit of provisional patent application No. 60/711,856 filed Aug. 26, 2005, entitled "Sharp Scattering Angle Trap for Electron Beam Apparatus," by inventors Yehiel Gotkis et al., which is hereby incorporated by reference in its entirety.

BACKGROUND OF THE INVENTION

1. Field of the Invention

The present invention relates generally to electron beam apparatus.

2. Description of the Background Art

Electron beam apparatus include, for example, scanning electron microscopes (SEMs), electron beam inspection/review tools, and electron beam metrology tools. The image quality of an electron beam apparatus is often undesirably compromised or reduced by various factors.

It is highly desirable to improve the quality of images obtained using electron beam apparatus.

BRIEF DESCRIPTION OF THE DRAWINGS

FIG. 1 is an illustrative diagram depicting a configuration in a conventional electron beam apparatus.

FIG. 2 shows example scattered electron trajectories in the conventional electron beam apparatus.

SUMMARY

Figure 3:
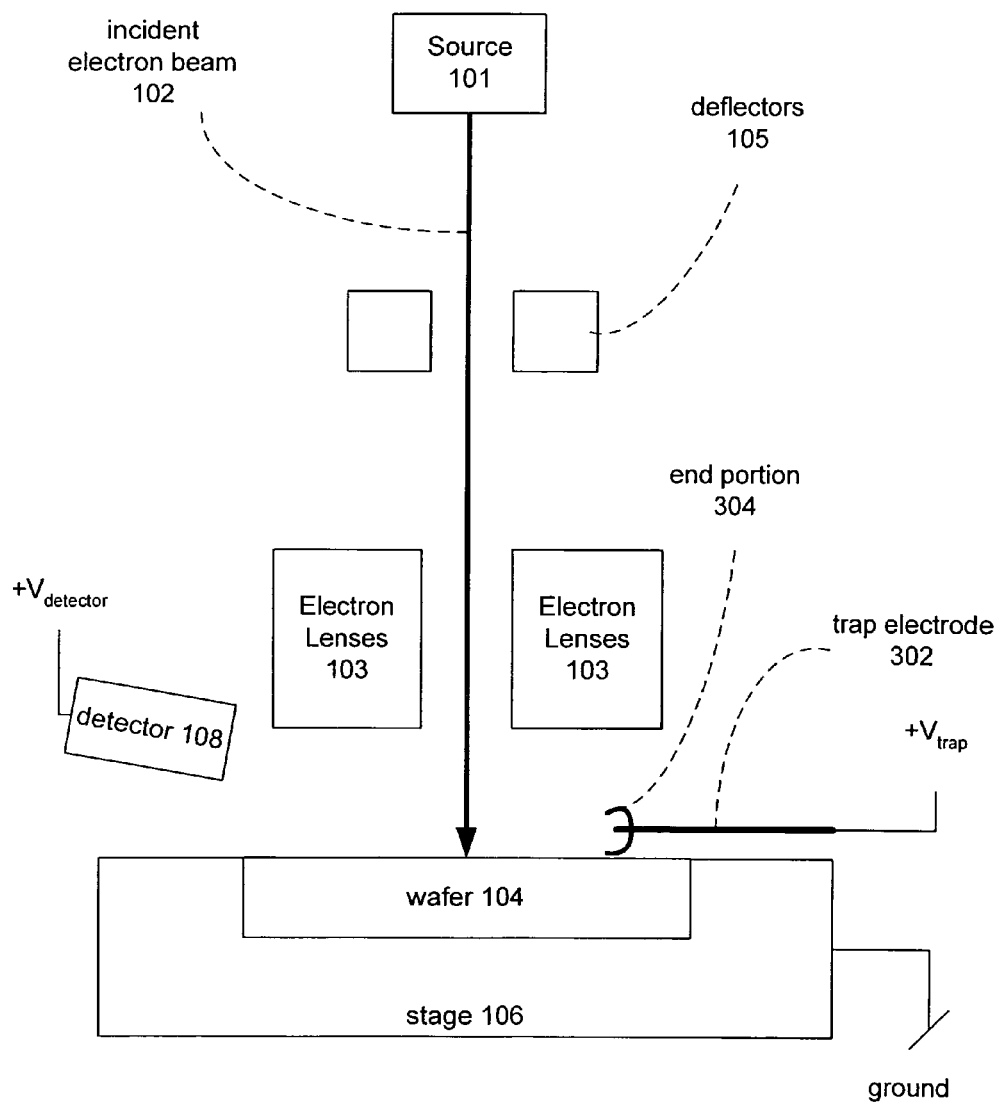
FIG. 3 is an illustrative diagram depicting a configuration in an electron beam apparatus with a sharp scattering angle trap in accordance with an embodiment of the invention.

One embodiment relates to an electron beam apparatus. The apparatus includes a source for generating an incident electron beam, an electron lens for focusing the incident electron beam so that the beam impinges upon a substrate surface and interacts with surface material so as to cause emission of scattered electrons, and a detector configured to detect the scattered electrons. The apparatus further includes an advantageous device configured to trap the scattered electrons which are emitted at sharp angles relative to the substrate surface plane.

Another embodiment relates to a method of imaging a surface area. An incident beam is generated, and the incident beam is focused so that the beam impinges upon a substrate surface and interacts with surface material so as to cause emission of scattered electrons. The scattered electrons are detected. Advantageously, there is trapping of the scattered electrons which are emitted at sharp angles relative to the substrate surface plane.

Other embodiments are also disclosed.

DETAILED DESCRIPTION

The present application discloses a technique to substantially improve image quality using an electron beam apparatus. As disclosed herein, the technique utilizes a mechanism to trap or screen electrons scattered at sharp (relatively to the sample surface plane) scattering angles. Unexpectedly and surprisingly, electron micrographs obtained using the technique disclosed herein appears to have substantially reduced adverse surface imaging effects.

FIG. 1 is a schematic diagram depicting a configuration in a conventional electron beam apparatus. Electron beam apparatus typically comprise, among other components, an electron gun or source 101, condenser lenses (not depicted), beam deflectors 105, electron lenses 103, and a detection system 108.

In FIG. 1, an electron source 101 generates an incident electron beam 102. One or more electron lens 103 focuses the beam 102 so that it impinges upon a surface of a semiconductor wafer 104. The wafer 104 is shown as being held in a stage 106. Deflectors 105 may be used to scan the beam 102 over the area being imaged.

A detector 108 for detecting secondary or scattered electrons is also depicted. As shown, the stage 106 may be electrically grounded, and a positive voltage $+V_{detector}$ may be applied to the detector 108 so as to attract the scattered electrons.

FIG. 2 schematically shows example scattered electron trajectories 202 in the conventional electron beam apparatus. In such a conventional electron beam apparatus, the probing electron beam 102 interacts with the surface material of the object under observation (for example, the surface of the wafer 104), and the resulting scattered electrons 202 are the information carriers about the structure under observation.

FIG. 3 is a schematic diagram depicting a configuration in an electron beam apparatus with a sharp scattering angle trap in accordance with an embodiment of the invention. As shown, the sharp scattering angle trap may be implemented as a trap electrode 302 to which a positive voltage $+V_{trap}$ is applied relative to the stage potential. Preferably, the trap electrode 302 is positioned very closely to the surface of the substrate under observation. The trap electrode 302 may include a semi-circular or otherwise shaped portion 304 at the end near the area under observation. This portion 304 may be used to increase the trapping effectiveness of the electrode 302.

Figure 4:
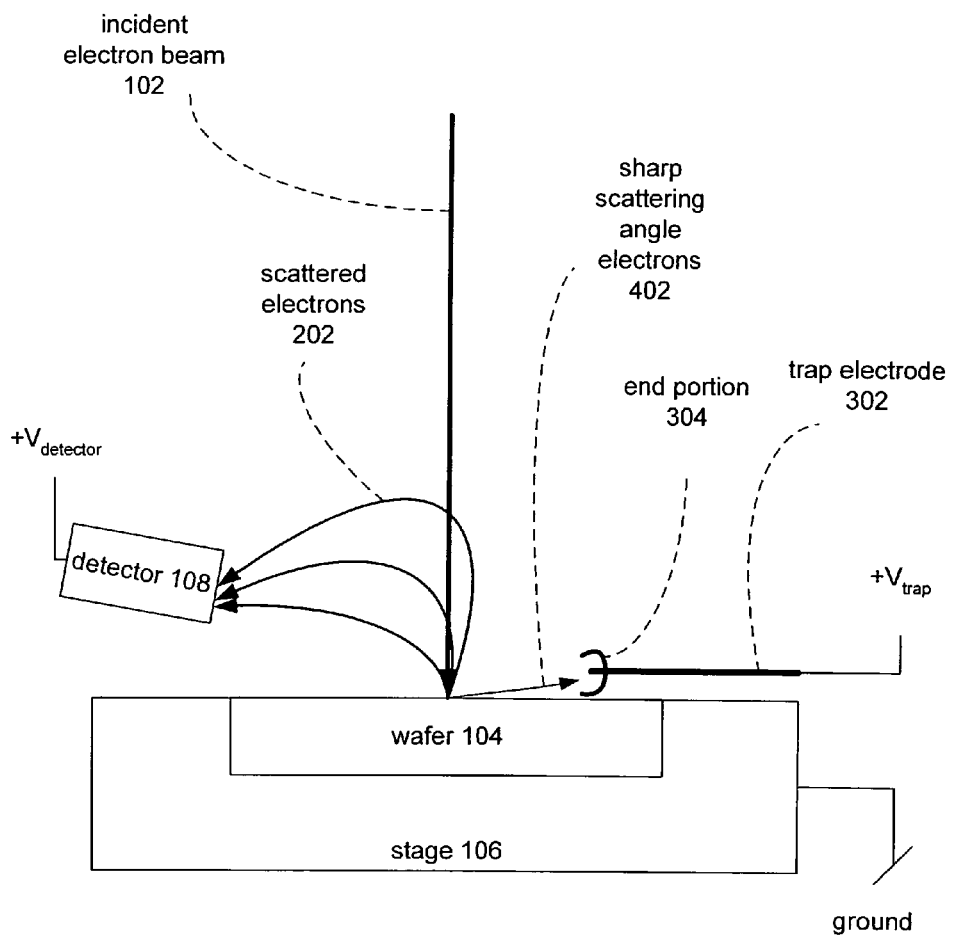
FIG. 4 schematically shows example scattered electron trajectories in the electron beam apparatus with a sharp scattering angle trap in accordance with an embodiment of the invention.

FIG. 4 shows example scattered electron trajectories in the electron beam apparatus with a sharp scattering angle trap in accordance with an embodiment of the invention. As shown in FIG. 4, scattered electrons 202 are generally attracted to and detected by the detector 108. However, those electrons 402 which are scattered at sharp angles into the vicinity of the trap electrode 302 are attracted to and captured by the trap electrode 302. In particular, the relative positive voltage attracts sharp-angle scattered electrons 402 to the end portion 304 of the trap electrode 302.

Applicants believe that such electrons 402 scattered at sharp angles relative to the surface plane often are generated within the uppermost material layers of the substrate 104. In other words, applicants believe that scattering events occurring within the uppermost material layers frequently result in sharp-angle scattered electrons 402 which travel at trajectories that are relatively near to the plane of the target surface.

Figure 5:
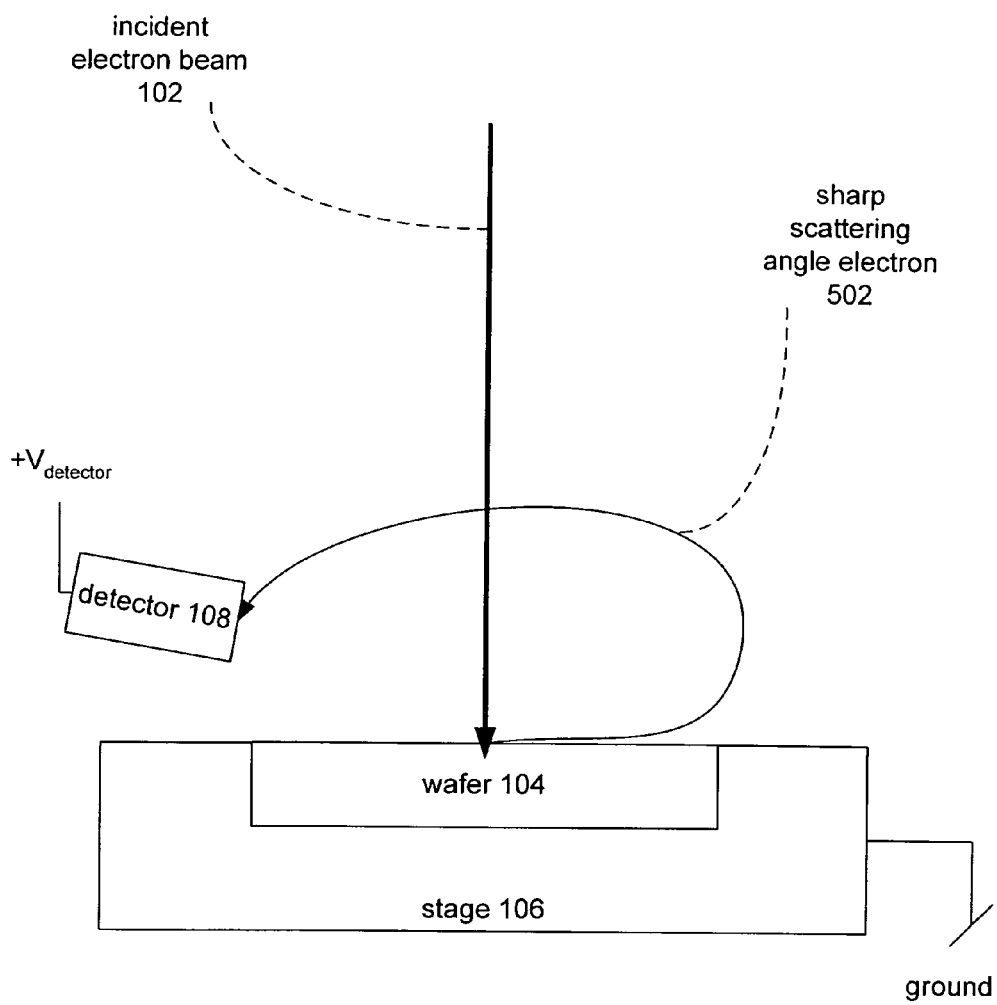
FIG. 5 shows an example trajectory of a sharp scattering angle electron in a conventional apparatus without a sharp scattering angle trap.

A schematic trajectory 502 of such a sharp-angle scattered electron in a conventional apparatus is depicted in FIG. 5. Because there is no sharp scattering angle trap in the configuration depicted in FIG. 5, the detector 108 eventually attracts and detects the sharp-angle scattered electrons. Applicants believe that these sharp-angle scattered electrons produce surface associated and frequently undesirable imaging effects.

Figure 6:
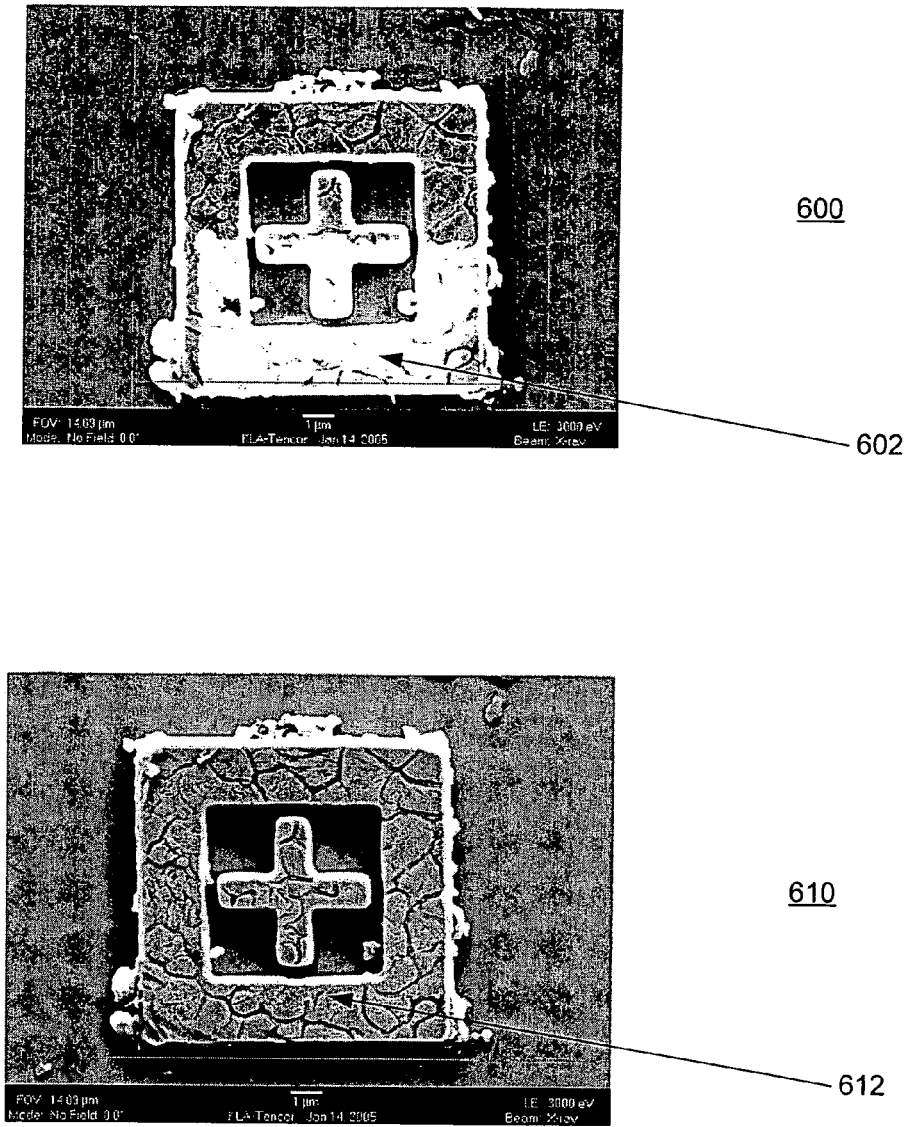
FIG. 6 shows electron micrographs of a surface structure taken without a sharp scattering angle trap and with a sharp scattering angle trap.

Scanning electron micrographs obtained by the applicants using a sharp scattering angle trap show substantial reduction of adverse surface imaging effects. For example, FIG. 6 shows scanning electron micrographs of a surface structure taken without a sharp scattering angle trap and with a sharp scattering angle trap. The upper electron micrograph 600 of FIG. 6 was taken without a sharp scattering angle trap and shows overly bright areas 602 which are obscured by a substantially higher intensity of detected electrons. Applicants believe that the higher intensity in these areas 602 is due to the upper surface layers having been intentionally modified.

In contrast, the lower electron micrograph 610 of FIG. 6 was taken with a sharp scattering angle trap being activated. This lower micrograph 610 is of the same area as the upper micrograph 600. Remarkably, the previously overly bright areas 612 are no longer obscured. Instead, substantial detail in these areas 612 is now visible. Advantageously, the improved visibility of the surface details provides for improved defect detection and/or review using an inspection or review tool.

Figure 7:
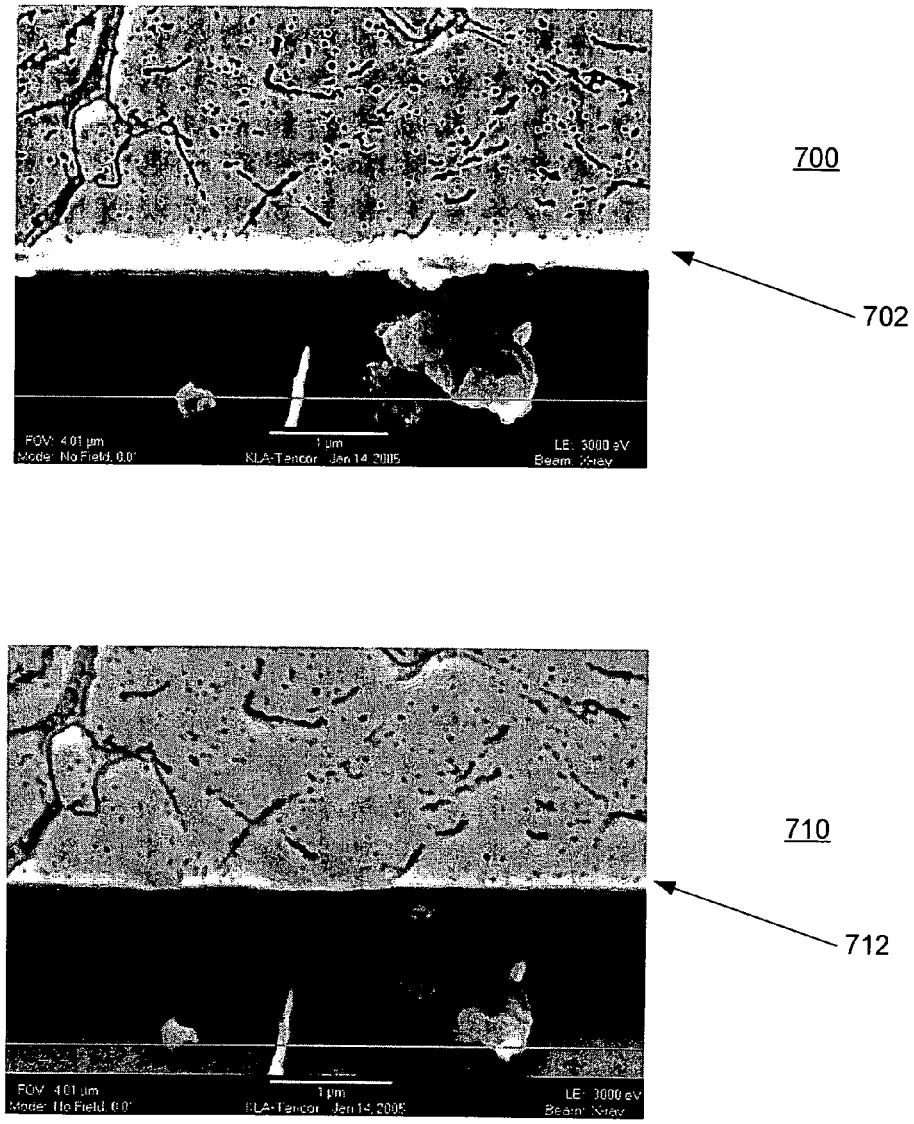
FIG. 7 shows electron micrographs of an edge structure taken without a sharp scattering angle trap and with a sharp scattering angle trap.

Another example is shown in FIG. 7. FIG. 7 shows electron micrographs of an edge structure taken without a sharp scattering angle trap and with a sharp scattering angle trap. The upper electron micrograph 700 of FIG. 7 was taken without a sharp scattering angle trap and shows substantial edge over-contrast. The edge over-contrast results in a relatively thick bright horizontal line 702 which masks the feature edge, making any edge associated measurements unreliable. Applicants believe that this edge over-contrast is due to a relatively higher proportion of electrons being scattered at sharp scattering angles in the vicinity of the edge.

In contrast, the lower electron micrograph 710 of FIG. 7 was taken with a sharp scattering angle trap being activated. This lower micrograph 710 is of the same area as the upper micrograph 700. Remarkably, the over-contrast at the edge 712 appears to have disappeared, such that the edge 712 is much better pronounced in the lower micrograph 710. Advantageously, more accurate edge profile characterization and associated measurements of critical dimensions may be made with such better-defined edges using a critical dimension scanning electron microscope (CD-SEM).

Figure 8:
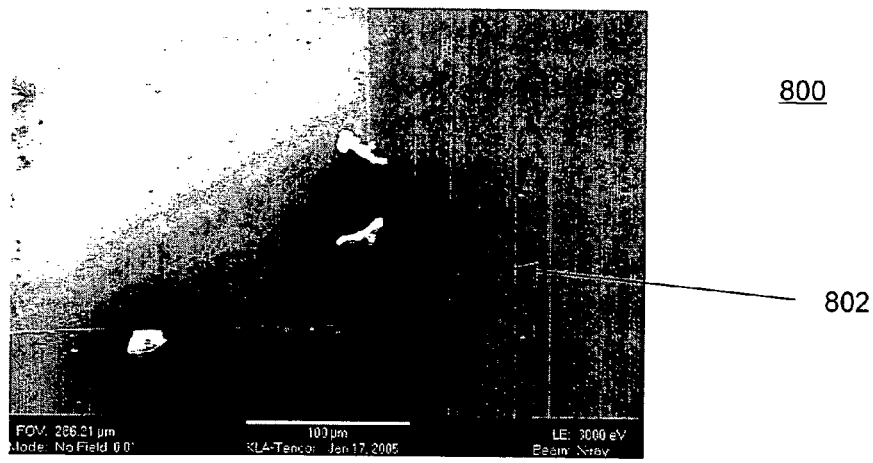
FIG. 8 shows electron micrographs of an area with particle defects taken without a sharp scattering angle trap and with a sharp scattering angle trap.
Figure 8:
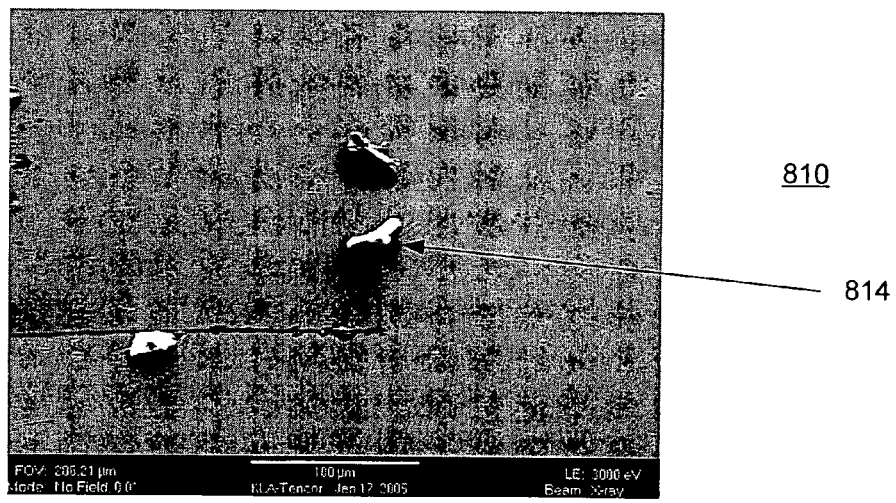

A third example is shown in FIG. 8. FIG. 8 shows electron micrographs of an area with particle defects taken without a sharp scattering angle trap and with a sharp scattering angle trap. The upper electron micrograph 800 of FIG. 8 was taken without a sharp scattering angle trap and shows darker regions 802 around the particles obscuring detail in the image. Applicants believe that the darker regions are due to the charging of particles on the surface of the substrate.

In contrast, the lower electron micrograph 810 of FIG. 8 was taken with a sharp scattering angle trap being activated. This lower micrograph 810 is of the same area as the upper micrograph 800. Remarkably, the darker regions 802 due to particle charging have disappeared, such that the particles 812 and other surface details are much better defined in the lower micrograph 810. Advantageously, such more accurate surface details provides for improved defect detection and/or review using an inspection or review tool.

Figure 9:
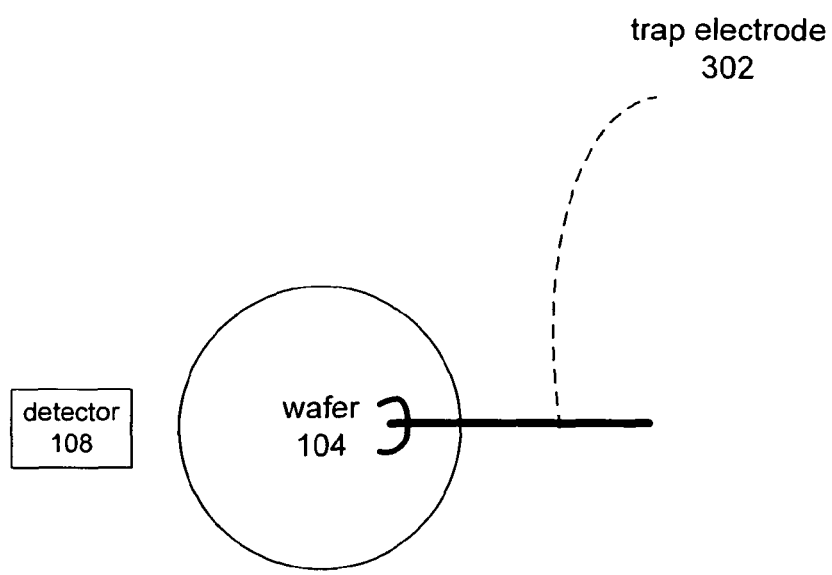
FIG. 9 depicts a plan (top) view of a configuration with a single electron trap in accordance with an embodiment of the invention.

FIG. 9 depicts a plan (top) view of a configuration with a single trap electrode 302 in accordance with an embodiment of the invention. As shown in FIG. 9, the trap electrode 302 is preferably positioned across from the secondary electron detector 108. In other words, the trap electrode 302 and the detector 108 are on opposite sides of the area being imaged.

Figure 10:
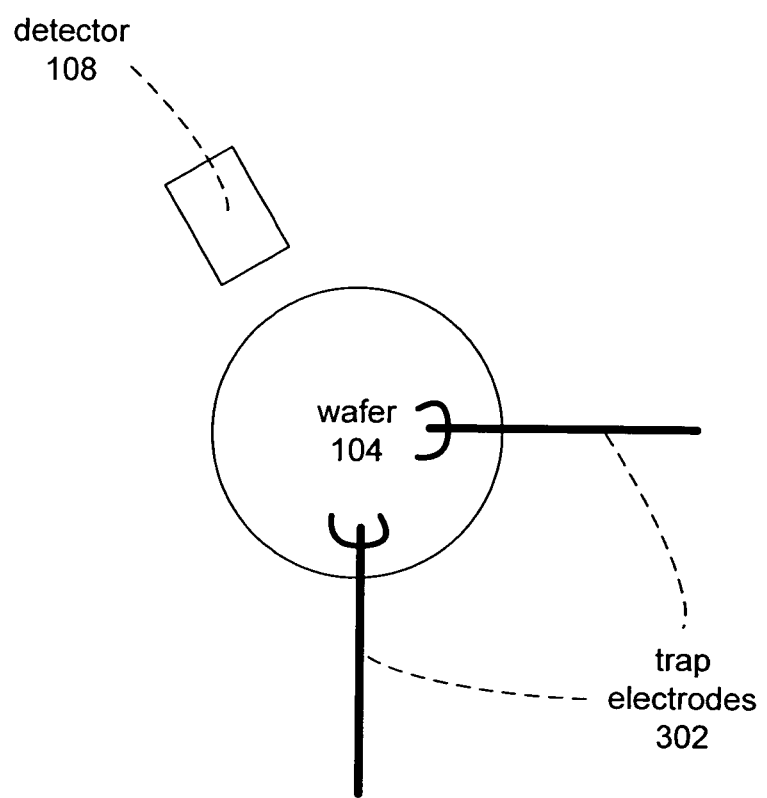
FIG. 10 depicts a plan (top) view of a configuration with multiple electron traps in accordance with an embodiment of the invention.

FIG. 10 depicts a plan (top) view of a configuration with multiple trap electrodes 302 in accordance with an embodiment of the invention. In the particular example shown, there are two trap electrodes 302, each electrode 302 being positioned opposite to the secondary electron detector 108. Of course, more than two electrodes and more than a single detector may be used in other implementations.

Figure 11:
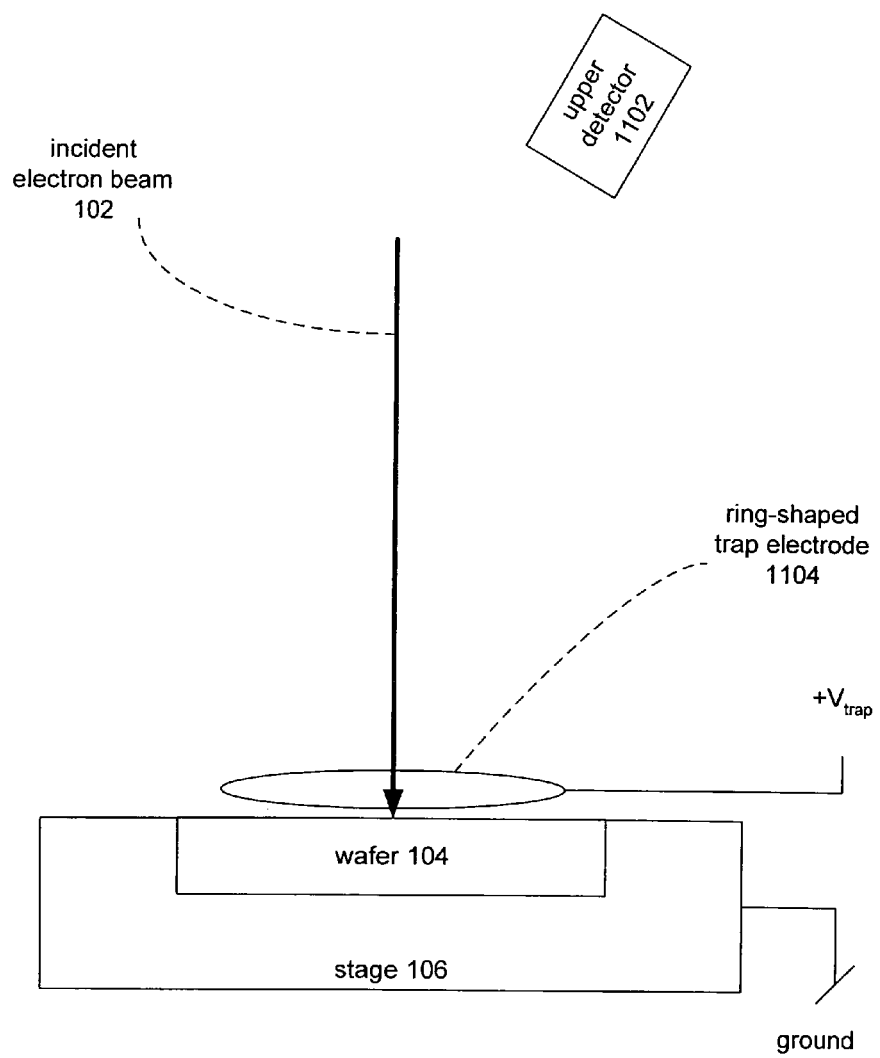
FIG. 11 is an illustrative diagram depicting a configuration with an upper detector and a ring-shaped trap in accordance with an embodiment of the invention.

FIG. 11 is an illustrative diagram depicting a configuration with an upper detector 1102 and a ring-shaped trap electrode 1104 in accordance with an embodiment of the invention. The ring-shaped trap electrode 1104 is configured circumferentially around the area being imaged. As in the other embodiments, the ring-shaped trap electrode 1104 has a positive voltage applied thereto relative to the stage potential so as to attract the sharp-angle scattered electrons. Meanwhile, other electrons (which are not sharp-angle scattered) are still able to make their way up the column to the upper detector 1102.

The above discussion includes theoretical reasons for the improved imaging observed in accordance with embodiments of the present invention. Although the theoretical reasons are believed to explain the improved imaging observed, it is not intended that the present invention necessarily be limited by such theory.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:
1. An electron beam apparatus comprising:
a source for generating an incident electron beam;
an electron lens closest to a substrate surface for focusing the incident electron beam so that the beam impinges upon the substrate surface and interacts with surface material so as to cause emission of secondary electrons;

a secondary electron detector configured at a first position above a plane of the substrate surface to detect secondary electrons traveling between the substrate surface and the electron lens closest to the substrate surface; and a trap electrode configured at a second position above the plane of the substrate surface and below the electron lens closest to the substrate surface to attract and capture the secondary electrons which are emitted within a range of scattering angles extending from the plane of the substrate surface so that the captured electrons are not detected by the secondary electron detector, wherein a positive voltage is applied to the trap electrode relative to a substrate potential, and wherein the first and second positions are across from each other with the incident electron beam impinging therebetween.

2. The electron beam apparatus of claim 1, wherein the trap electrode comprises an end portion with a semi-circular shape which increases said range of scattering angles.

3. The electron beam apparatus of claim 1, wherein the substrate surface comprises a semiconductor wafer surface.

4. The electron beam apparatus of claim 1, wherein the device comprises multiple separate trap electrodes, each trap electrode being configured at a position above the substrate surface and below the electron lens closest to the substrate surface, and each trap electrode having a semi-circular end portion.

5. The electron beam apparatus of claim 1 further comprising deflectors to scan the beam across an area of interest, wherein the deflectors are positioned between the source and the electron lens closest to the substrate surface.

6. The electron beam apparatus of claim 5, wherein the apparatus comprises a critical dimension scanning electron microscope (CD-SEM).

7. The electron beam apparatus of claim 5, wherein the apparatus comprises an inspection or review tool.

8. The electron beam apparatus of claim 1, wherein the trap electrode comprises a ring-shaped trap electrode configured circumferentially around the incident electron beam.

9. A method of imaging a surface area, the method comprising:

generating an incident beam;

focusing the incident beam by a lens closest to a substrate surface so that the beam impinges upon the substrate surface and interacts with surface material so as to cause emission of secondary electrons;

detecting the secondary electrons by a secondary electron detector, wherein the detected secondary electrons travel between the substrate surface and the lens closest to the substrate surface; and attracting and capturing the secondary electrons which are emitted within a range of scattering angles extending from a plane of the substrate surface by a trap electrode positioned above the substrate surface and below the lens closest to the substrate surface so that the captured electrons are not detected by the secondary electron detector; and applying a positive voltage to the trap electrode relative to a substrate potential, wherein said detecting of the secondary electrons and said capturing of the secondary electrons are performed at positions across from each other with the incident beam impinging therebetween.

10. The method of claim 9, wherein-the trap electrode comprises a ring-shaped trap electrode configured circumferentially around the incident electron beam.

11. The method of claim 10, wherein the substrate surface comprises a semiconductor wafer surface.

12. The method of claim 9, further comprising generating an image from the detected secondary electrons.

13. The method of claim 12, further comprising inspecting or reviewing the image for defects.

14. The method of claim 12, further comprising measuring a critical dimension of a feature in the image.

15. The method of claim 9, wherein the trap electrode comprises a ring-shaped trap electrode configured circumferentially around the incident beam.

16. An apparatus for imaging a surface area, the apparatus comprising:

means for generating an incident beam;

a lens closest to a substrate surface for focusing the incident beam so that the beam impinges upon the substrate surface and interacts with surface material so as to cause emission of secondary electrons;

means for detecting secondary electrons traveling between the substrate surface and the lens closest to the substrate surface; and a trap electrode positioned above the substrate surface and below the lens closest to the substrate surface for attracting and capturing the secondary electrons which are emitted within a range of scattering angles extending from a plane of the substrate surface so that the captured electrons are not detected by the means for detecting, wherein said means for detecting and the trap electrode are positioned across from each other with the incident beam impinging therebetween.

17. The apparatus of claim 16, wherein the trap electrode comprises a ring-shaped trap electrode configured circumferentially around the incident beam.

* * * * *